United States Patent
Chatterjee et al.

(10) Patent No.: US 8,906,454 B2
(45) Date of Patent: Dec. 9, 2014

(54) METHODS FOR DEPOSITING METAL-POLYMER COMPOSITE MATERIALS ATOP A SUBSTRATE

(75) Inventors: Sukti Chatterjee, Cupertino, CA (US); Amit Chatterjee, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 39 days.

(21) Appl. No.: 13/608,172

(22) Filed: Sep. 10, 2012

(65) Prior Publication Data

US 2013/0065401 A1 Mar. 14, 2013

Related U.S. Application Data

(60) Provisional application No. 61/533,406, filed on Sep. 12, 2011.

(51) Int. Cl.

| | |
|---|---|
| *C23C 16/00* | (2006.01) |
| *C23C 16/44* | (2006.01) |
| *C23C 16/30* | (2006.01) |
| *C23C 16/46* | (2006.01) |
| *B05D 1/00* | (2006.01) |
| *B05D 5/08* | (2006.01) |

(52) U.S. Cl.
CPC . *B05D 1/60* (2013.01); *C23C 16/44* (2013.01); *C23C 16/30* (2013.01); *C23C 16/46* (2013.01); *B05D 2601/28* (2013.01); *B05D 5/083* (2013.01)
USPC ........................................................ 427/248.1

(58) Field of Classification Search
CPC .. C23C 16/24; C23C 16/54; H01L 21/02532; H01L 21/0262
USPC .......................................................... 427/248.1
See application file for complete search history.

(56) References Cited

U.S. PATENT DOCUMENTS

| | | | |
|---|---|---|---|
| 2011/0045349 A1* | 2/2011 | Pushparaj et al. | 429/212 |
| 2011/0100955 A1* | 5/2011 | Pushparaj et al. | 216/37 |
| 2012/0295419 A1 | 11/2012 | Chatterjee et al. | |
| 2012/0312326 A1 | 12/2012 | Chatterjee et al. | |
| 2013/0048987 A1 | 2/2013 | Chatterjee | |

FOREIGN PATENT DOCUMENTS

JP   2004027243 A * 1/2004

OTHER PUBLICATIONS

International Search Report and Written Opinion mailed Jan. 24, 2013 for PCT Application No. PCT/US2012/041078.
International Search Report and Written Opinion mailed Mar. 4, 2013 for PCT Application No. PCT/US2012/054575.

* cited by examiner

*Primary Examiner* — Kelly M Gambetta
(74) *Attorney, Agent, or Firm* — Moser Taboada; Alan Taboada

(57) ABSTRACT

Methods for depositing metal-polymer composite materials atop a substrate are provided herein. In some embodiments, a method of depositing a metal-polymer composite material atop a substrate disposed in a hot wire chemical vapor deposition (HWCVD) chamber may include flowing a current through a plurality of filaments disposed in the HWCVD chamber, the filaments comprising a metal to be deposited atop a substrate; providing a process gas comprising an initiator and a monomer to the HWCVD chamber; and depositing a metal-polymer composite material on the substrate using species decomposed from the process gas and metal atoms ejected from the plurality of filaments.

14 Claims, 3 Drawing Sheets

METHODS FOR DEPOSITING METAL-POLYMER COMPOSITE MATERIALS ATOP A SUBSTRATE

CROSS-REFERENCE TO RELATED APPLICATIONS

This application claims benefit of U.S. provisional patent application Ser. No. 61/533,406, filed Sep. 12, 2011, which is herein incorporated by reference.

FIELD

Embodiments of the present invention generally relate to semiconductor substrate processing, and more particularly, to methods for depositing metal-polymer composite materials atop a substrate.

BACKGROUND

Conventionally, metal-polymer composite materials, (e.g., metal-polymer nano materials) may be synthesized using a liquid based method, for example, such as solution melt, melt processing, emulsion, or the like. However, the inventors have observed that when forming metal-polymer nanocomposite materials using liquid based methods, the metal nano particles tend to agglomerate within the polymer matrix, leading to non uniform distribution of the metal nano particles within the polymer matrix.

Therefore, the inventors have provided improved methods of depositing composite materials atop a substrate.

SUMMARY

Methods for depositing metal-polymer composite materials atop a substrate are provided herein. In some embodiments, a method of depositing a metal-polymer composite material atop a substrate disposed in a hot wire chemical vapor deposition (HWCVD) chamber may include flowing a current through a plurality of filaments disposed in the HWCVD chamber, the filaments comprising a metal to be deposited atop a substrate; providing a process gas comprising an initiator and a monomer to the HWCVD chamber; and depositing a metal-polymer composite material on the substrate using species decomposed from the process gas and metal atoms ejected from the plurality of filaments.

In some embodiments, a computer readable medium is provided having instructions stored thereon that, when executed, cause a method of depositing a metal-polymer composite material atop a substrate disposed in a hot wire chemical vapor deposition (HWCVD) chamber to be performed. The method may be any of the inventive methods as described herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
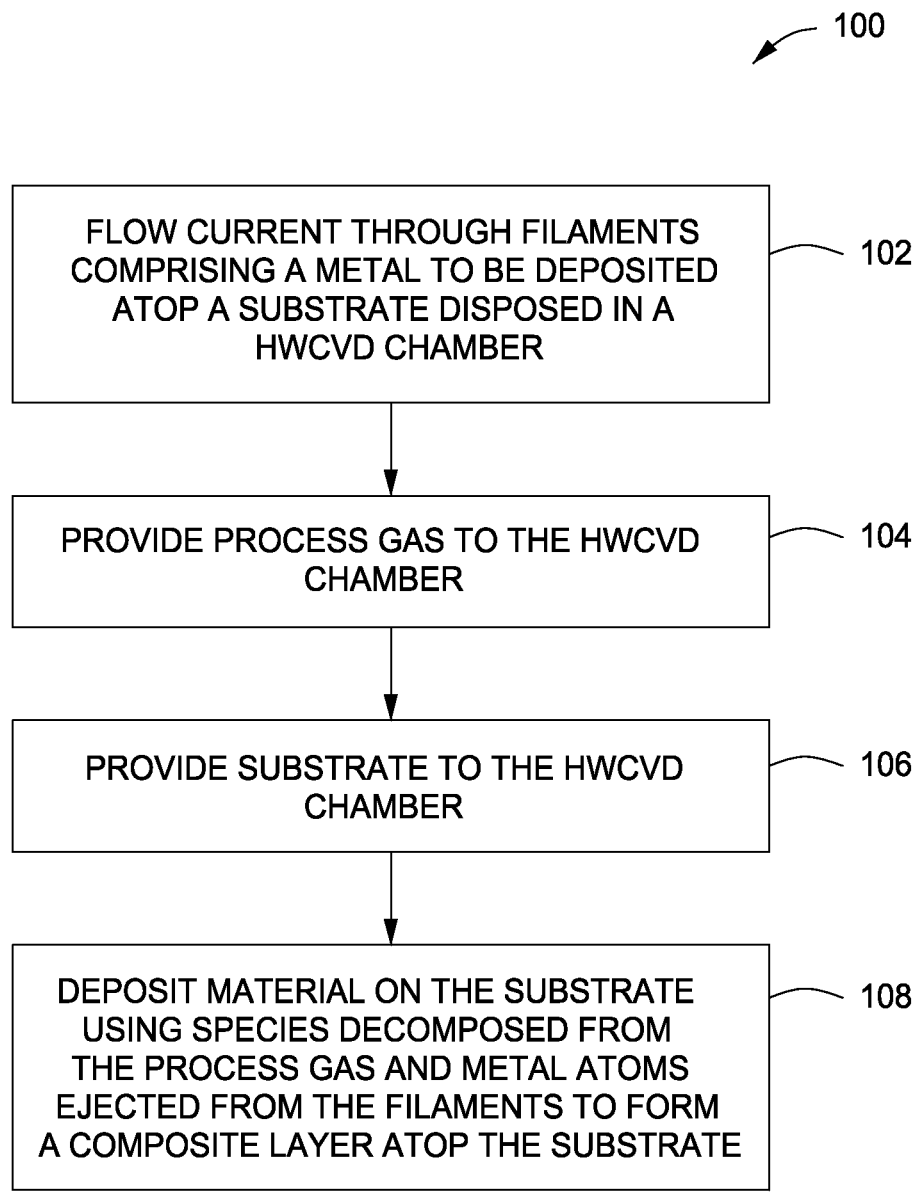
FIG. 1 is a flow diagram of a method for depositing a composite material atop a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for depositing metal-polymer composite materials atop substrates using hot wire chemical vapor deposition (HWCVD) processes. The inventive methods may advantageously utilize HWCVD to form metal-polymer nanocomposite materials having stoichiometric polymers that retain full chemical functionality and polymer fiber length. The inventive methods may further advantageously provide metal-polymer nanocomposite materials having a uniform distribution of metal nano particles throughout the polymer matrix. Although not limiting of the scope of application of the inventive methods disclosed herein, the inventive methods have been shown to be particularly effective for the deposition of composite materials for optical, electrical, ballistic, biomedical and catalytic magnetic applications. As used herein nanocomposites, and the prefix nano-, generally refer to materials wherein at least one dimension of the material is less than 100 nanometers (nm), or wherein a pitch or average distance between particles or elements is less than 100 nm. Although described herein as useful for the fabrication of nano-scale composite materials, embodiments of the present invention may also be used to deposit larger scale materials and layers as well.

Figure 2A:
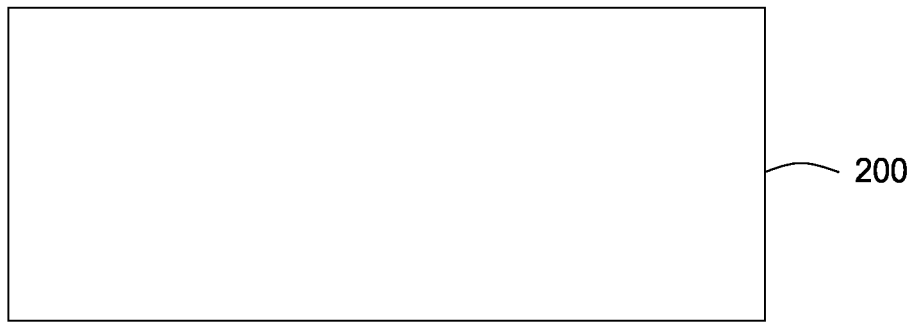
FIGS. 2A-B are illustrative cross-sectional views of a substrate during different stages of the processing sequence of FIG. 1 in accordance with some embodiments of the present invention.
Figure 2B:
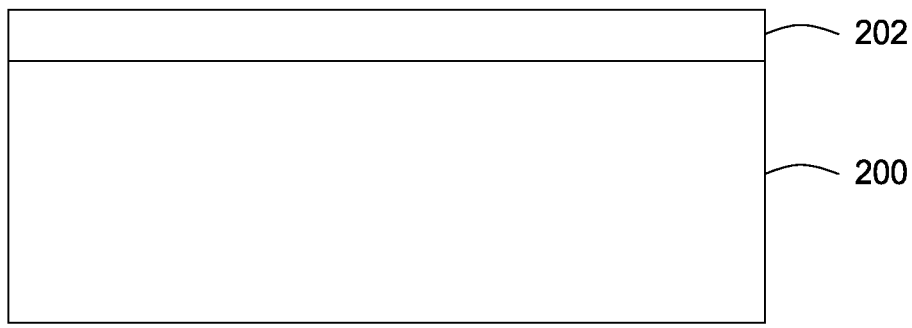

FIG. 1 is a flow diagram of a method 100 for depositing a metal-polymer composite material atop a substrate in accordance with some embodiments of the present invention. FIGS. 2A-B are illustrative cross-sectional views of the substrate during different stages of the processing sequence of FIG. 1 in accordance with some embodiments of the present invention. The inventive methods may be performed in any apparatus suitable for processing semiconductor substrates in accordance with embodiments of the present invention, such as the apparatus discussed below with respect to FIG. 3.

The method begins at 102, where a current is flowed through a plurality of filaments comprising a metal to be deposited atop a substrate (e.g., substrate 200 described below) disposed in a HWCVD chamber. By providing the current to the plurality of filaments, the plurality of filaments may be heated to a temperature sufficient to reduce or remove contaminants and/or byproducts from previous processes from the HWCVD chamber, thereby reducing or eliminating the risk of contaminating the substrate during processing. The contaminants and/or byproducts may be disposed on the wires and/or on other components of the process chamber. In some embodiments, the plurality of filaments may be maintained at a temperature continuously between subsequent processes performed in the HWCVD chamber, eliminating the need for repetitive heating and cooling of the filaments, which may reduce the overall amount of energy consumed, prolong the life of the plurality filaments, and/or increase the efficiency of the process. In addition, by providing the current to the plurality of filaments the HWCVD chamber (e.g., the HWCVD chamber described below) may be heated up to a temperature necessary for deposition of the metal-polymer composite material. In any of the above embodiments, by flowing the current through the plurality of filaments, the plurality of filaments may be heated to a temperature of about 500 to about 1000 degrees Celsius.

The plurality of filaments may be any suitable type of filaments in any suitable type of HWCVD chamber, such as the plurality of filaments disposed in the HWCVD chamber described below with respect to FIG. 3. The plurality of filaments may be fabricated from any process compatible material suitable to provide a desired metal to be deposited atop the substrate for a particular application. For example, in embodiments where the metal-polymer composite material comprises a metal-polymer nanocomposite layer having iron (Fe) nano particles disposed in a polymer matrix, the plurality of filaments may be fabricated from a steel alloy in order to contribute iron (Fe) atoms. The plurality of filaments may be fabricated from other metals as well, for example, such as silver (Ag), aluminum (Al), nickel (Ni), or the like.

Next, at 104, a process gas may be provided to the HWCVD chamber. The process gas may be provided to the HWCVD chamber at any flow rate suitable to perform the deposition, for example, such as about 10 to about 100 sccm. The process gas may comprise any gas or gases suitable to deposit the desired composite material atop the substrate. For example, in embodiments where the composite layer is a metal-polymer nanocomposite layer having metal nano particles disposed in a polymer matrix the process gas may comprise an initiator and a monomer. In such embodiments, any initiator and monomer may be utilized to provide a desired polymer matrix. For example, in embodiments where the polymer matrix comprises polytetrafluoroethylene (PTFE), the initiator may comprise perfluorooctanesulfonyl fluoride (POSF) and the monomer may comprise hexafluoropropylene oxide (HFPO). Other initiators may be utilized, for example, such as perfluorooctane sulfonyl fluoride, perfluorobutane sulfonyl fluoride, perfluoropentane sulfonyl fluoride, tert-butyl peroxide or the like. In addition, other monomers may be utilized, such as hexafluoropropylene oxide, tetrafluoroethylene, difluorocarbene, chlorodifluomethane, perfluorooctanoic acid or the like.

The initiator and monomer may be provided in any ratio necessary to form the desired polymer matrix. For example, in some embodiments, the initiator and monomer may be provided in a ratio of initiator to monomer of about 1:10 to about 1:1. In some embodiments, the initiator and monomer may be provided to the HWCVD chamber together, or in some embodiments, provided separately to the HWCVD chamber and allowed to mix within the HWCVD chamber during processing.

In some embodiments, the process gas may comprise additional gases, for example such as a carrier gas, dilutant gas, or the like. In such embodiments, the additional gases may comprise inert gases, for example, such as helium (He), neon (Ne), argon (Ar), or the like. In some embodiments, the inert gas may be provided at a flow rate of about 10 to about 100 sccm. In some embodiments, the inert gas may be argon (Ar).

At 106, the substrate is provided to the HWCVD chamber. The substrate may be provided to the HWCVD chamber either before or after heating the filaments, but typically prior to providing the process gas to the HWCVD chamber. Referring to FIG. 2A, the substrate 200 may be any suitable substrate for a desired application, such as a doped or un-doped silicon substrate, a III-V compound substrate, a silicon germanium (SiGe) substrate, a silicon nitride (SiN) substrate, an epi-substrate, a silicon-on-insulator (SOI) substrate, a substrate comprising one or more metals such as copper (Cu), a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer, such as a 200 or 300 mm semiconductor wafer. In some embodiments, the substrate 200 may be a large scale LCD or glass substrate, for example, such as an about 1000 mm×1250 mm substrate or an about 2200 mm×2500 mm substrate.

In some embodiments, the substrate 200 may comprise one or more layers suitable for semiconductor fabrication, for example, oxide layers, nitride layers, high or low K dielectric layers, conductive layers, or the like. The layers may be formed via any suitable process, for example, such as physical vapor deposition, chemical vapor deposition, epitaxial growth, or the like. Alternatively or in combination, in some embodiments, one or more features (e.g., a via, a trench, a dual damascene structure, or the like) may be formed in the substrate 200 and/or one or more layers formed thereon. The features may be formed via any suitable process, for example such as an etch process. In addition, the substrate 200 may undergo additional processing prior to preheating, such as annealing, baking, cleaning, or the like.

At 108, a material is deposited atop the substrate 200 using species decomposed from the process gas and metal atoms ejected from the plurality of filaments to form the composite layer 202. In some embodiments, by causing the decomposition of the process gas components (e.g., the initiator and monomer described above), a polymer matrix is formed atop the substrate 200. In such embodiments, the metal atoms ejected from the plurality of filaments form metal nano dots in the polymer matrix, thus creating a metal-polymer nanocomposite layer (composite layer 202).

To facilitate the deposition, the HWCVD chamber may be maintained at a temperature suitable to facilitate decomposition of the process gas and the ejection of metal atoms from the plurality of filaments. In addition, the inventors have observed that when depositing composite materials comprising metal nano particles disposed in a polymer matrix atop a substrate, the size and density of the metal nano particles may be adjusted by varying the temperature. For example, in some embodiments, the filaments in the HWCVD chamber may be maintained at a temperature of about 500 to about 700 degrees Celsius. In addition to the above, additional process parameters may be utilized to facilitate forming the composite layer 202 on the substrate 200. For example, in some embodiments, the HWCVD chamber may be maintained at a pressure of about 100 to about 1000 mTorr.

To facilitate the deposition of the material, the substrate 200 may be positioned under a HWCVD source (e.g., the filaments or wires 310 described below with respect to FIG. 3) such that the substrate 200 is exposed to the process gas and decomposed species thereof, thereby allowing the material to deposit on the substrate 200 to form the composite layer 202. The substrate 200 may be positioned under the HWCVD source on a substrate support (e.g., substrate support 328 described below with respect to FIG. 3) in a static position or, in some embodiments, may move for dynamic deposition as the substrate 200 passes under the HWCVD source.

After depositing the material to form the composite layer 202 at 108, the method 100 generally ends and the substrate 200 may proceed for further processing. In some embodiments, additional processes such as additional layer depositions, etching, annealing, or the like, may be performed on the substrate 200, for example, to form a semiconductor device on the substrate 200 or to prepare the substrate 200 for use in applications such as photovoltaic cells (PV), light emitting diodes (LED), or displays (e.g., liquid crystal display (LCD), plasma display, electro luminescence (EL) lamp display, or the like).

Figure 3:
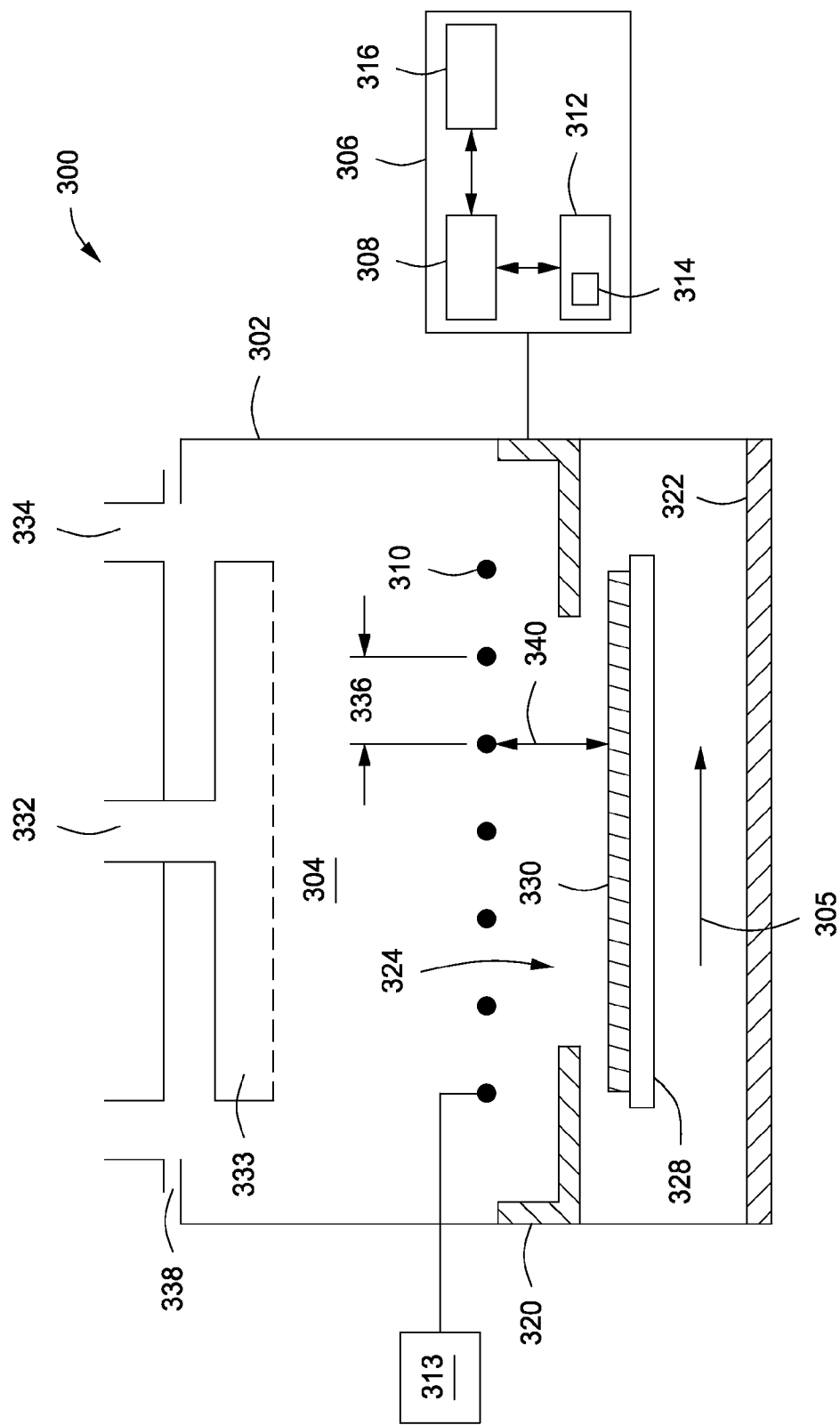
FIG. 3 is a hot wire chemical vapor deposition (HWCVD) chamber suitable for performing the methods depicted in FIG. 1 in accordance with some embodiments of the present invention.

FIG. 3 depicts a schematic side view of a HWCVD process chamber 300 suitable for use in accordance with embodiments of the present invention. The process chamber 300 generally comprises a chamber body 302 having an internal processing volume 304. A plurality of filaments, or wires 310, are disposed within the chamber body 302 (e.g., within the internal processing volume 304). The plurality of wires 310 may also be a single wire routed back and forth across the internal processing volume 304. The plurality of wires 310 comprise a HWCVD source. The wires 310 may comprise any suitable conductive material, for example, such as the materials described above. The wires may 310 comprise any thickness suitable to provide a desired temperature to facilitate a process in the process chamber 300. For example, in some embodiments, each wire 310 may comprise a diameter of about 0.2 to about 1 mm. The increase of filament diameter may increase metal sources in the gas phase. Consequently, the size and density of the metal nano dots may be enhanced in the metal-polymer nanocomposites.

Each wire 310 is clamped in place by support structures (not shown) to keep the wire taught when heated to high temperature, and to provide electrical contact to the wire. In some embodiments, a distance between each wire 310 (i.e., the wire to wire distance 336) may be varied to provide a desired temperature profile within the process chamber 300. In addition, the inventors have observed that when depositing composite materials comprising metal nano particles disposed in a polymer matrix atop a substrate (e.g., as described above), the size and density of the metal nano particles may be adjusted by varying the distance 336 between each wire 310. For example, in some embodiments, the wire to wire distance 336 may be about 10 to about 60 mm.

A power supply 313 is coupled to the wire 310 to provide current to heat the wire 310. A substrate 330 may be positioned under the HWCVD source (e.g., the wires 310), for example, on a substrate support 328. The substrate support 328 may be stationary for static deposition, or may move (as shown by arrow 305) for dynamic deposition as the substrate 330 passes under the HWCVD source. In some embodiments, a distance between each wire 310 and the substrate 330 (i.e., the wire to substrate distance 340) may be varied to facilitate a particular process being performed in the process chamber 300. For example, in some embodiments, the wire to substrate distance 340 may be about 20 to about 60 mm.

The chamber body 302 further includes one or more gas inlets (one gas inlet 332 shown) to provide one or more process gases and one or more outlets (two outlets 334 shown) to a vacuum pump to maintain a suitable operating pressure within the process chamber 300 and to remove excess process gases and/or process byproducts. The gas inlet 332 may feed into a shower head 333 (as shown), or other suitable gas distribution element, to distribute the gas uniformly, or as desired, over the wires 310.

In some embodiments, one or more shields 320 may be provided to minimize unwanted deposition on interior surfaces of the chamber body 302. The one or more shields 320 define an opening 324 corresponding to the deposition area on the substrate 330 as it passes beneath the opening 324. Alternatively or in combination, one or more chamber liners 322 can be used to make cleaning easier. The use of shields, and liners, may preclude or reduce the use of undesirable cleaning gases, such as the greenhouse gas $NF_3$. The shields 320 and chamber liners 322 generally protect the interior surfaces of the chamber body from undesirably collecting deposited materials due to the process gases flowing in the chamber. The shields 320 and chamber liners 322 may be removable, replaceable, and/or cleanable. The shields 320 and chamber liners 322 may be configured to cover every area of the chamber body that could become coated, including but not limited to, around the wires 310 and on all walls of the coating compartment. Typically, the shields 320 and chamber liners 322 may be fabricated from aluminum (Al) and may have a roughened surface to enhance adhesion of deposited materials (to prevent flaking off of deposited material). The shields 320 and chamber liners 322 may be mounted in the desired areas of the process chamber, such as around the HWCVD sources, in any suitable manner. In some embodiments, the source, shields, and liners may be removed for maintenance and cleaning by opening an upper portion of the deposition chamber. For example, in some embodiments, the a lid, or ceiling, of the deposition chamber may be coupled to the body of the deposition chamber along a flange 338 that supports the lid and provides a surface to secure the lid to the body of the deposition chamber.

A controller 306 may be coupled to various components of the process chamber 300 to control the operation thereof. Although schematically shown coupled to the process chamber 300, the controller may be operably connected to any component that may be controlled by the controller, such as the power supply 312, a gas supply (not shown) coupled to the inlet 332, a vacuum pump and or throttle valve (not shown) coupled to the outlet 334, the substrate support 328, and the like, in order to control the HWCVD deposition process in accordance with the methods disclosed herein. The controller 306 generally comprises a central processing unit (CPU) 308, a memory 312, and support circuits 316 for the CPU 308. The controller 306 may control the HWCVD process chamber 300 directly, or via other computers or controllers (not shown) associated with particular support system components. The controller 306 may be one of any form of general-purpose computer processor that can be used in an industrial setting for controlling various chambers and sub-processors. The memory, or computer-readable medium, 312 of the CPU 308 may be one or more of readily available memory such as random access memory (RAM), read only memory (ROM), floppy disk, hard disk, flash, or any other form of digital storage, local or remote. The support circuits 316 are coupled to the CPU 308 for supporting the processor in a conventional manner. These circuits include cache, power supplies, clock circuits, input/output circuitry and subsystems, and the like. Inventive methods as described herein may be stored in the memory 312 as software routine 314 that may be executed or invoked to turn the controller into a specific purpose controller to control the operation of the process chamber 300 in the manner described herein. The software routine may also be stored and/or executed by a second CPU (not shown) that is remotely located from the hardware being controlled by the CPU 308.

Thus, methods for depositing composite materials atop a substrate are provided herein. The inventive methods may advantageously utilize HWCVD to form metal-polymer nanocomposite materials having stoichiometric polymers that retain full chemical functionality and polymer fiber length, as opposed to cross-linked, fragmented or scrambled polymer fibers typically produced using other conventionally used CVD processes, for example such as plasma enhanced chemical vapor deposition (PECVD). The inventive methods may further advantageously provide metal-polymer nano-composite materials having a uniform distribution of metal nano particles throughout the polymer matrix. Although not limiting of the scope of application of the inventive methods disclosed herein, the inventive methods have been shown to be particularly effective for the deposition of composite materials for optical, electrical, ballistic, biomedical and catalytic magnetic applications.

While the foregoing is directed to embodiments of the present invention, other and further embodiments of the invention may be devised without departing from the basic scope thereof.

The invention claimed is:

1. A method of depositing a metal-polymer composite material atop a substrate disposed in a hot wire chemical vapor deposition (HWCVD) chamber, comprising:
   flowing a current through a plurality of filaments disposed in the HWCVD chamber, the filaments comprising a metal to be deposited atop a substrate;
   providing a process gas comprising an initiator and a monomer to the HWCVD chamber; and
   depositing a metal-polymer composite material on the substrate using species decomposed from the process gas by and metal atoms ejected from the plurality of filaments wherein the metal-polymer composite material comprises iron (Fe) nano dots disposed in a polytetrafluoroethylene (PTFE) matrix.

2. The method of claim 1, wherein the plurality of filaments are fabricated from a steel alloy, silver (Ag), aluminum (Al), or nickel (Ni).

3. The method of claim 1, wherein the metal is iron (Fe), silver (Ag), aluminum (Al), or nickel (Ni).

4. The method of claim 1, wherein the initiator comprises at least one of perfluorooctanesulfonyl fluoride, perfluorooctane sulfonyl fluoride, perfluorobutane sulfonyl fluoride, perfluoropentane sulfonyl fluoride, or tert-butyl peroxide.

5. The method of claim 1, wherein the monomer comprises at least one of hexafluoropropylene oxide, hexafluoropropylene oxide, tetrafluoroethylene, difluorocarbene, chlorodifluoromethane, or perfluorooctanoic acid.

6. The method of claim 1, wherein depositing the material on the substrate comprises:
   moving the substrate through a processing volume of the HWCVD chamber to expose the substrate to the process gas; and
   depositing the material atop the substrate as it moves through the processing volume of the HWCVD chamber.

7. The method of claim 1, wherein each of the plurality of filaments are disposed about 10 to about 60 mm from another adjacent filament.

8. The method of claim 1, wherein the plurality of filaments are disposed about 20 to about 60 mm above the substrate.

9. The method of claim 1, wherein each of the plurality of filaments have a diameter of about 0.2 to about 1 mm.

10. The method of claim 1, wherein the filaments of the HWCVD chamber is maintained at a temperature of about 500 to about 700 degrees Celsius while depositing the material atop the substrate.

11. The method of claim 1, wherein the process gas further comprises an inert gas.

12. The method of claim 1, wherein the initiator and monomer are provided in a ratio of initiator to monomer of about 1:10 to about 1:1.

13. The method of claim 1, further comprising:
   providing the substrate to the HWCVD chamber after flowing the current through the plurality of filaments.

14. The method of claim 1, wherein the plurality of metal filaments are heated to a temperature sufficient to decompose the process gas and eject metal atoms from the plurality of metal filaments.

* * * * *